United States Patent [19]

Logan et al.

[11] 4,093,345
[45] June 6, 1978

[54] SEMICONDUCTOR RIB WAVEGUIDE OPTICAL MODULATOR WITH HETEROJUNCTION CONTROL ELECTRODE CLADDING

[75] Inventors: Ralph Andre Logan, Morristown; Franz Karl Reinhart; William Robert Sinclair, both of Summit, all of N.J.

[73] Assignee: Bell Telephone Laboratories, Incorporated, Murray Hill, N.J.

[21] Appl. No.: 690,650

[22] Filed: May 27, 1976

[51] Int. Cl.$^2$ .............................................. G02B 5/14
[52] U.S. Cl. .............................. 350/355; 331/94.5 H; 350/96.14
[58] Field of Search ............. 350/160 R, 96 WG, 150; 331/94.5 M, 94.5 H; 357/16, 61; 332/7.51

[56] References Cited

U.S. PATENT DOCUMENTS

| | | | |
|---|---|---|---|
| 3,748,597 | 7/1973 | Reinhart | 332/7.51 |
| 3,859,178 | 1/1975 | Logan et al. | 204/15 |
| 3,951,513 | 4/1976 | Masi | 350/96 WG |
| 3,978,426 | 8/1976 | Logan et al. | 331/94.5 H |
| 3,984,173 | 10/1976 | Shaw | 350/96 WG |

OTHER PUBLICATIONS

Vossen, "RF Sputtered Transparent Conductors, the System In$_2$O$_3$–SnO$_2$", RCA Review, vol. 32, Jun. 1971, pp. 289–296.
Papuchon et al., "Electrically Switched Optical Directional Coupler:Cobra", Applied Physics Letters, vol. 27, No. 5, pp. 289–291, Sep. 1975.
Aiki et al., "GaAs-GaAlAs Distributed-Feedback Diode Lasers with Separate Optical and Carrier Confinement", Applied Physics Letters, vol. 27, No. 3, Aug. 1, 1975, pp. 145–146.
Köstlin et al., "Optical and Electrical Properties of Doped In$_2$O$_3$ Films", Properties of Doped In$_2$O$_3$ Films, 1975, pp. 87–93.
Fraser et al., "Highly Conductive, Transparent Films of Sputtered In$_{2-x}$Sn$_x$O$_{3-y}$", J. Electrochem Soc.: Solid-State Science and Technology, Oct. 1972, pp. 1368–1374.
Anderson, "Photocurrent Suppression in Heterojunction Solar Cells", Applied Physics Letters, vol. 27, No. 12, Dec. 15, 1975, pp. 691–693.
Reinhart et al., "Transmission Properties of Rib Waveguides Formed by Anodization of Epitaxial GaAs on Al$_x$Ga$_{1-x}$As Layers", Applied Physics Letters, vol. 24, No. 6, Mar. 15, 1974, pp. 270–272.

*Primary Examiner*—Stanley D. Miller, Jr.
*Assistant Examiner*—James W. Davie
*Attorney, Agent, or Firm*—David I. Caplan

[57] ABSTRACT

Formation of an optical modulator in an optical rib waveguide configuration in an epitaxial semiconductor layer is facilitated by using an electrode cladding (electrically conducting-optically transparent) layer for contacting the rib portion of the epitaxial layer. The electrode cladding layer is essentially a polycrystalline compound semiconductive material of suitably low refractive index and is advantageously characterized by a relatively high (0.4 to 1.0 volt or more) heterojunction potential barrier height at the epitaxial layer. The electrode cladding layer results in relatively low optical waveguide cladding loss as well as good electrode contact, thereby facilitating the application of a modulating electric field into the epitaxial rib waveguide during operation. The electrode cladding layer can also serve as a mask for controllably forming the rib portion with a predetermined rib height in the epitaxial layer.

19 Claims, 4 Drawing Figures

SEMICONDUCTOR RIB WAVEGUIDE OPTICAL MODULATOR WITH HETEROJUNCTION CONTROL ELECTRODE CLADDING

FIELD OF THE INVENTION

This invention relates to the field of semiconductor apparatus, and more particularly to integrated semiconductor optical waveguide modulators.

BACKGROUND OF THE INVENTION

In the use of optical radiation for various purposes, such as communications, it is desired to have a means to modulate the intensity of an optical beam. For example, in U.S. Pat. No. 3,748,597 issued to F. K. Reinhart (one of the inventors herein) on July 24, 1973, optical modulators were described using multilayers of different semiconductor materials of differing refractive indices. Moreover, in a paper published in *Applied Physics Letters*, Vol. 24, No. 6, pp. 270–272 (Mar. 15, 1974), authored by F. K. Reinhart, R. A. Logan (two of the inventors herein) and T. P. Lee, the transmission properties of epitaxial semiconductor rib waveguides were described. These rib waveguides were formed by geometrically selective anodization of epitaxial GaAs on $Al_xGa_{1-x}As$ layers, the "rib" being defined as that portion of the epitaxial layer of somewhat larger thickness than the remainder ("slab") of the epitaxial layer. Optical radiation propagating in the epitaxial layer along the rib direction tends to be confined in a portion of the epitaxial layer underlying the top of the rib surface (where the epitaxial layer has the larger thickness).

A semiconductor rib waveguide is thus useful in lateral confinement and waveguiding of a propagating optical beam. However, the height of the rib (equal to the difference in thickness between the rib portion and the remaining slab portion of the epitaxial layer) is an important parameter whose value must be carefully controlled in order to provide desired optical propagation in certain desired predetermined mode(s), ordinarily lowest order single mode propagation. Moreover, in order to have a means for modulating the optical radiation in accordance with an electrical signal, an electrode contact to the rib is required. In application, Ser. No. 557,250, filed on March 11, 1975, by R. A. Logan, J. L. Merz, F. K. Reinhart, and H. G. White, now U.S. Pat. No. 3,978,426, which issued on Aug. 31, 1976, a regrown epitaxial gallium aluminum arsenide layer was suggested for electrode contact to the semiconductor waveguide; however, such a contact as formed in an integrated optical device would require epitaxial regrowth on predetermined areas without affecting other semiconductive opitcal components, and would thus be difficult to accomplish in combination with rib waveguide structures. Moreover, the use of an electrical insulator layer, of relatively low refractive index such as silicon dioxide ($n = 1.5$), for an optical buffer layer between an overlying metal electrode and the thin semiconductor waveguide suffers from the problem of undue electrical modulation field loss in the rib waveguide for the case of thick insulator buffer layers and the problem of pinholes in the oxide (which are filled by the ultimately overlying metal electrode) causing localized breakdown in the semiconductor waveguide for the case of thin insulator buffer layers. It would therefore be desirable to have a rib waveguide structure with a relatively easily controllable rib height and at the same time to have a simple and easily fabricated electrode, characterized by both low optical loss and good electrical conductivity, for modulating the optical properties of the rib waveguide.

SUMMARY OF THE INVENTION

A semiconductor optical rib waveguide structure comprising a first epitaxial layer supporting a second ("rib waveguide") epitaxial layer, characterized by advantageous optical and electrical properties, is afforded by a transparent semiconductive electrode layer deposited on a major plateau surface of the rib waveguide epitaxial semiconductor layer, forming a heterojunction barrier layer contact to the rib portion of such a waveguide structure. By a "heterojunction barrier layer contact to the rib" is meant a layer of material contacting the rib semiconductor, but of a different chemical composition from that of the rib semiconductor, forming a heterojunction with the semiconductor rib whereat is thereby created an internal potential barrier height of at least about 0.3 volt, advantageously in the range of about 0.4 to 1.0 volt or more. Advantageously, the material of the transparent electrode is essentially a polycrystalline chemical compound having at least one constituent (excluding impurities) chemical element which is not in common with the constituent chemical elements of either the first or second epitaxial layers. Advantageously, also, the refractive index of the bulk material of the electrode cladding layer is lower by a significant amount than that of the rib with which it is in barrier layer contact, so that this electrode also serves as an optical cladding layer for confining the optical modes within the rib waveguide. Such a low refractive index electrode cladding material also perturbs the inherent waveguide properties (propagation constants and mode carrying capacity) very little. The free carrier concentration of the electrode cladding layer is sufficiently high, advantageously at least one to two orders of magnitude higher than that of the waveguide layer, so that the depletion layer penetration into the cladding at the barrier becomes negligibly small ($< 0.1$ micron). Moreover, the exposed surface of the electrode cladding layer can be easily contacted by a metal layer for attaching thereto an external electrical network for modulating the optical radiation. Also, electrode cladding layer is advantageously of polycrystalline structure, thereby enabling relative ease of fabrication of this electrode cladding layer on the then exposed surface of the underlying epitaxial waveguide layer. Such a polycrystalline layer is characterized by a polycrystal grain size of the order of typically about 200 angstroms. Moreover, the material for this electrode layer is advantageously selected so that it can serve as a mask against the processing step, such as etching or oxidation, which is used to form the rib structure into the epitaxial layer; that is, the electrode layer protects and maintains the thickness of the underlying second epitaxial layer while the remaining slab portion of the second epitaxial layer is being reduced in thickness by such a processing step.

The ability to fabricate such electrode cladding layers in this invention complements the techniques previously available for forming integrated semiconductor optical circuits. Using single heterostructure waveguides for discrete device component interconnection, with gratings and ribs formed for control over optical laser source frequency and optical mode propagation, respectively, the low loss electrical cladding contact of this invention may be formed on either the grating or the rib section, to add further circuit functions without elaborate high temperature crystal regrowth processes.

In order to form a specific embodiment of the invention, upon a major surface of a monocrystalline semiconductor substrate is grown a first epitaxial layer of a first thickness and of a first bulk refractive index semiconductor material of the same conductivity type as that of substrate. Upon the exposed major surface of the first epitaxial layer is grown a second epitaxial layer of a second (smaller) thickness and of a second (high) refractive index semiconductor material of the same conductivity type as that of the first epitaxial layer. At this time, there is an exposed major surface of the second epitaxial layer which is substantially planar. A transparent electrode layer, of an electrically conductive but optically transparent compound semiconductive material of lower refractive index than that of the second epitaxial layer, is then deposited over the exposed major surface of the second epitaxial layer, thereby forming a heterojunction barrier layer contact. In order to form the rib structure, the electrode layer is selectively removed, in accordance with the desired electrode pattern; that is, the electrode layer is removed everywhere except from those areas where the rib waveguide is to be formed, by a processing method that does not affect the epitaxial layers. Then, the second expitaxial layer is selectively consumed (removed by etching or oxidized) down to a depth equal to the desired rib height of the rib portion of the waveguide, using the electrode cladding layer as a mask against the selective removal or oxidation of the epitaxial layer. Typically, the substrate is n-type gallium arsenide, the first epitaxial layer is n-type aluminum gallium arsenide ($Al_xGa_{1-x}As$), the second epitaxial layer is also n-type aluminum gallium arsenide ($Al_yGa_{1-y}As$) but having a smaller fraction of aluminum to gallium than that of the first epitaxial layer ($y<x$), and the electrode cladding layer is indium-tin oxide. Ohmic contacts to the substrate and to the electrode cladding layer enable the application of a modulating electric field, for modulating either the optical intensity or optical phase (depending upon optical wavelength and polarization, as well as epitaxial crystal band gap energy and crystallographic orientation). Such a modulator is useful in a variety of contexts, such as integrated optical directional coupler switching devices and integrated optical transisitor devices (amplification of electrical signals through the intermediary of optical radiation).

BRIEF DESCRIPTION OF THE DRAWING

This invention, together with its features, objects, and advantages, may be better understood from the following detailed description when read in conjunction with the drawings, in which.

For the purpose of clarity only, none of the drawings is to scale.

DETAILED DESCRIPTION

Figure 1:
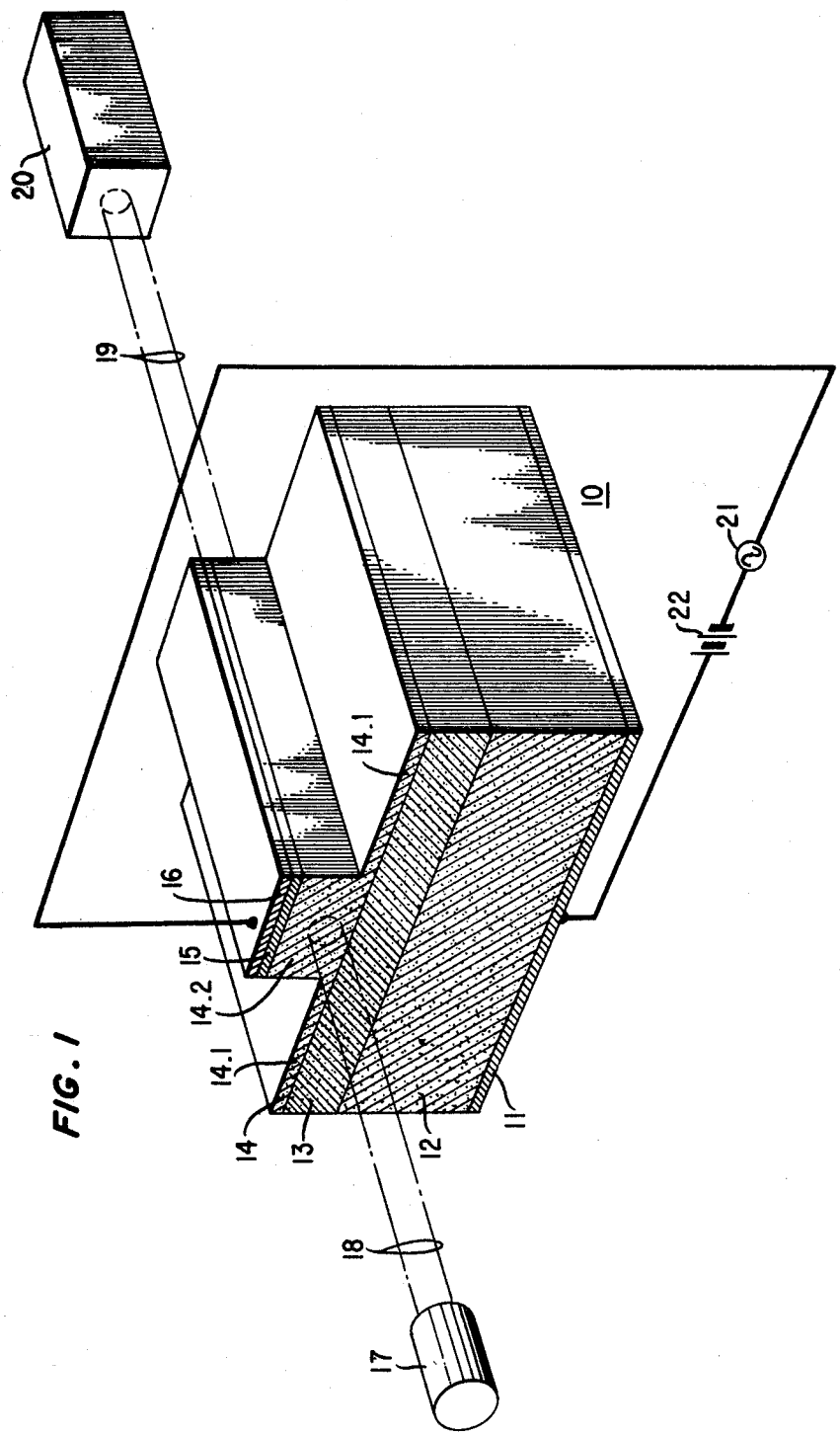
FIG. 1 is a perspective view of a semiconductor rib waveguide optical modulator, in accordance with a specific embodiment of the invention.

As shown in FIG. 1, a semiconductor rib waveguide optical modulator device 10 includes a monocrystalline substrate 12 of n-type gallium arsenide supporting a first epitaxial layer 13 of n-type aluminum gallium arsenide (typically liquid phase grown $Al_xGa_{1-x}As$, $x=0.3$ approx.), a second epitaxial layer 14 of n-type aluminum gallium arsenide having a lower aluminum-to-gallium ratio (typically liquid phase grown $Al_yGa_{1-y}As$, $y=0.15$ approx.) than that of the first epitaxial layer, a layer 15 of electrode cladding material contacting a rib portion 14.2 of the second epitaxial layer 14, an ohmic electrode contact layer 16, typically of gold, ohmically contacting the electrode cladding layer 15; and an electrode contact layer 11, typically of tin, ohmically contacting the substrate 12. A source 17 of optical radiation directs an input beam of light 18 into the modulator 10 whereby the beam propagates in a rib waveguide mode through the rib waveguide. The lateral extent of the mode is determined by the combination of the lateral extent and step height of the rib 14.2. A modulated output beam 19, whose intensity varies in accordance with an electrical signal supplied by a signal source 21, exits from the rib waveguide for utilization by a utilization means 20. A reverse bias D.C. voltage means 22, in series with the signal source 21, supplies a voltage bias in the range of between typically about 0.1 and 12 volts, that is, sufficient to overcome thermal fluctuations in the second epitaxial layer but not sufficient to cause breakdown during operation.

It should be noted again that, solely for the purpose of clarity, the drawing is not to scale. Moreover, again for purpose of clarity, the drawing omits various possible well-known optical coupling means for optically coupling the input and output light beams to the modulator 10.

The substrate 12 of n-type GaAs has a uniform bulk resistivity in the range of about 0.0005 to 0.01 ohm-cm, typically 0.003 ohm-cm. The first epitaxial layer 13 is typically about 2.5 micron in thickness with a bulk resistivity of typically about 0.01 ohm-cm, owing to impurities of tin (Sn) for example, in a concentration of typically about $10^{17}$ per cubic centimeter. The bulk refractive index of this first epitaxial layer 13 for an optical wavelength (in vacuum) of about 0.886 micron is thus typically about 3.394. The rib portion 14.2 of the second epitaxial layer 14 is typically 5 micron in lateral extent and about 0.7 micron thick; whereas the remaining "slab" portion 14.1 of the second epitaxial layer 14 is about 0.6 micron thick (corresponding to a rib height of about $(0.7-0.6)= 0.1$ micron). Also, this second epitaxial layer 14 has a bulk resistivity of typically about 0.02 ohm-cm owing to impurities of Sn in a concentration of typically about $5\times10^{16}$ per cubic centimeter. The first and second epitaxial layers are typically grown by liquid phase epitaxy, and thereby form a single heterostructure on the substrate. The electrode cladding layer 15 is polycrystalline indium-tin oxide having a refractive index of typically about 1.9 and a bulk resistivity of advantageously less than 0.1 ohm-cm, typically of about 0.002 ohm-cm, that is, a free carrier concentration at least an order of magnitude greater than that of the second epitaxial layer. This indium-tin oxide layer can be formed in a number of ways. For example, the indium-tin oxide can be sputter-deposited to a thickness of 0.5 micron or less, typically at $5\times10^{-3}$ torr in argon at room temperature, from a hot pressed target electrode, typically of 91 percent $In_2O_3$ and 9 percent $SnO_2$ by weight. Methods for sputter-depositing the indium-tin oxide are described, for example, in articles by D. B. Fraser et al in 119 *J. Electrochem, Soc.*, 1368 (1972) and by J. L. Vossen in 32 *RCA Review* 289 (1971); and a useful method for chemical deposition at low temperature (below about 500° C) is described by H. Kostlin et al in *Physica Status Solidi*, Vol. A29, 87 (1975). Prior to deposition of this electrode-cladding material, ordinarily the exposed aluminum gallium arsenide layer 14 is cleaned by anodization at about 10 to 50 volts followed by stripping of the oxide in HCl.

It shouold be noted that anodization followed by oxide stripping of the surface of the aluminum gallium arsenide layer 14 would not (without further surface cleaning) provide sufficient surface cleanliness for the regrowth of a continuous layer of aluminum gallium arsenide or of such a layer with suitable single crystal structure free of defects. Such defects in a regrown waveguide are deleterious to operation in that they produce additional optical scattering loss and correspondingly suffer from effectively reduced confinement of the radiation to the desired rib waveguide mode.

Alternatively, a cadmium oxide electrode cladding layer can be used instead of the indium-tin oxide, as deposited for example by sputtering of a cadmium oxide electrode.

The heterojunction which is formed between the electrode cladding layer 15 of indium-tin oxide and the surface of the second aluminum gallium arsenide layer 14 is advantageously characterized by a barrier potential thereat of between about 0.4 and 1.0 volt, depending upon the concentration of free carriers and interface states arising during the formation of this indium-tin oxide layer.

The rib structure of the modulator 10 can be fabricated as follows. First, conventional liquid phase epitaxy is used for growing the first and second epitaxial layers 13 and 14, followed by depositing the electrode cladding layer 15 of indium-tin oxide ($In_2O_3$-$SnO_2$) as mentioned above. In order to introduce the rib waveguide pattern into the indium-tin oxide layer 15, this layer 15 is selectively etched in accordance with the desired rib pattern, typically using an etching solution of hot (50° C) hydrochloric acid in conjunction with a conventional photoresist mask against such etching. Alternatively, a solution of 3 parts hydrofluoric acid and 7 parts water at room temperature can be used as the etching solution to etch the indium-tin oxide layer. When using a conventional photoresist mask, to achieve optimum pattern resolution, it is important to limit the time of exposure to the solution which is used for etching the masked indium-tin oxide layer, typically to about only ten seconds. This etching of the indium-tin oxide layer does not attack the exposed surface of the second epitaxial layer 14 at all so long as the aluminum-to-gallium ratio in this layer 14 is less than about 0.4 (typically, less than about 0.2), which is desirable for the purpose of good control over the height of the rib to be formed. Then the rib pattern is introduced into the second epitaxial layer 14 by anodization, typically in an acidic electrolyte solution of superoxol (30 percent hydrogen peroxide in water) or in an acidic water solution, with phosphoric acid added in either event to adjust the pH to about 2.5. During this anodization, typically an anode voltage of about +100 volts (relative to a platinum electrode) is applied to the substrate 12 while this substrate is electrically connected to the second epitaxial layer, by a metal clamp for example, so that the electrical potential of the second epitaxial layer is the same as that of the substrate (while immersed in the electrolyte solution). This anodization process thereby oxidizes the slab portion 14.1 of the second epitaxial layer 14, whereas the rib portion 14.2 is protected against oxidation by the indium-tin oxide layer 15. By controlling the voltage of anodization to 150 volts in the superoxol electrolyte, or to 100 volts in the acidic water solution, the resulting height of the (unoxidized) semiconductive rib portion is the desired 0.1 micron. Then, the tin electrode contact layer 11 is applied to the exposed surface of the substrate 12. The gold (ohmic) electrode contact layer 16 is deposited on the electrode cladding layer 15, typically by evaporation, and is selectively etched by conventional photoresist masking using an etching solution typically of iodine and potassium iodide in water. Alternatively, a silver paste or silver epoxy can be used instead of gold for ohmic contact to the indium-tin oxide layer. Since the slab portion 14.1 of the aluminum gallium arsenide material of the second epitaxial layer 14 is insulated and protected by its own native oxide formed during anodization, the mask used for selective removal of the ohmic electrode contact layer on the indium-tin oxide layer need not be in precise registry with the rib pattern defined by the indium-tin oxide layer itself.

Instead of the above-described anodization of the second epitaxial layer 14 to form the rib structure, the rib can be formed on the second epitaxial layer by double anodization procedures as, for example, described in U.S. Pat. No. 3,859,178 issued to R. A. Logan (one of the inventors herein) and B. I. Miller on Jan. 7, 1975, and the electrode cladding layer can then be applied to the exposed major surface of the second epitaxial layer; and finally the electrode cladding layer can be removed everywhere except at those areas comprising the exposed surface of the rib. Also, to form the rib structure, an ion milling technique can be used in which the electrode cladding layer serves as a mask for protecting the underlying rib portion 14.2. Alternatively, chemical etching with a solution of 0.1 percent bromine in methanol can be used to etch the second epitaxial layer. However, an important advantage of anodization is that the semiconductor oxide thereby formed at the surface of the slab portion 14.1 has a significantly lower refractive index than that of the second epitaxial layer 14 and therefore may be left in place for passivation and insulation without significantly disturbing the optical modes during operation.

The breakdown voltage of the modulator device 10, with a doping to the extent of $10^{17}$ donors or less per cubic centimeter in the second epitaxial layer 14, is about 15 volts or more. Phase shifts for rib waveguide TE modes of about 16° (about 0.27 radian) per signal volt for a rib waveguide of 0.1 cm in length (160° /volt-cm) were measured at an optical wavelength of 0.9 micron.

The surface of the second epitaxial layer 14 in contact with the indium-tin oxide layer can be at various crystallographic orientations, such as crystal plane (100). Depending upon this crystallographic orientation, as well as the optical wavelength and the optical rib waveguide mode, various types and amounts of modulations of optical phase shift and optical intensity can be observed. In each case, the bulk electrooptic effect and the waveguiding effect in response to signal voltage both can play a role in determining the total phase shift. It is important that the heterojunction barrier at the rib-electrode cladding interface be at least about 0.3 volt in potential barrier height, in order to provide good control and depth of optical modulation. Moreover, when the electric field polarization of the incident optical wavebeam 18 is parallel to the [110] crystallographic direction, the modulation produced in response to the signal source 21 is such as to rotate the plane of polarization through an angle proportional to the signal. On the other hand, when the electric vector of the incident optical beam is oriented parallel to the [111] or [100] directions, then the beam undergoes a pure phase modulation. Moreover, when the optical wavelength approaches that associated with a photon energy corresponding to the band gap energy of the second epitaxial layer, then large direct optical absorption effects in accordance with the signal can be obtained (without the need for added polarizer elements).

In case cadmium oxide is used for the electrode cladding layer, ion milling or double anodization techniques can be used for forming the rib structure.

In order to test the optical propagation properties of a purely slab waveguide structure similar to that of the modulator 10 (but absent any rib structure, that is, to test the effect solely of the indium-tin oxide electrode cladding layer 15), a structure similar to that described above was fabricated with a first region having such an electrode cladding and a second region absent such a cladding. Although the cladded region had a reduced optical transmission characteristic as compared with the uncladded region in the case of a relatively short (0.1 millimeter) sample device along the optical propagation direction; nevertheless, a sample of relatively long (0.5 millimeter) length showed little reduced optical transmission of the cladded versus the uncladded sample. Accordingly, optical transmission losses in the cladded sample were concluded to have been caused primarily by reduced optical mode coupling into and out of the structure, rather than by optical scattering losses attributable to the presence of the electrode cladding layer 15. These relatively small losses in the electrode cladding, in turn, are believed to be a consequence of the relatively small fraction of the optical energy propagating in the relatively low bulk dielectric constant electrode cladding layer ($n_e = 1.9$) compared with that of the rib ($n_r = 3.4$), the spatial decay constant of the optical fields (to the l/e value) in the indium-tin oxide layer 15 being calculated to be less than about 0.024 micron for a optical wavelength of about 0.89 micron in the case where the second epitaxial layer 14 is aluminum gallium arsenide, $Al_{0.15}Ga_{0.85}As$. This advantageous relatively small optical penetration into the electrode cladding is attributable to the relatively large value of $n_r^2 - n_e^2$, advantageously greater than $0.3n_r^2$.

Thus, the electrode cladding layer can be made quite thin, less than about 0.5 micron, without significant additional optical loss. At the same time, this ability to use such a thin electrode cladding layer enables easier control over the rib width, by enabling relatively short etching times for removing unwanted slab portions of the electrode cladding material, that is, the removal of those portions of the electrode cladding layer which overly the ultimately desired slab portion 14.1 of the second epitaxial layer 14; so that this electrode cladding can itself serve as a quickly and easily formed mask for use during subsequent formation of the rib by further etching.

Although the waveguide layer 14 has been described as a uniformly doped n-type layer of lower doping level than that of the first epitaxial layer 13, it should be understood that this waveguide layer can alternatively be a composite layer of a p-type conductivity layer on an n-type conductivity layer of approximately the same doping levels and thickness (adding to about 0.7 micron). Thereby, a p-n junction is formed in the waveguide layer, the p-type layer being contacted by the electrode cladding layer 15 and the n-type layer by the first epitaxial layer 13. This p-n junction then has an associated depletion region wherein optical modulation by means of the applied electric field can be produced. Moreover, n-type and p-type conductivity can be interchanged everywhere in a given structure, since a given electrode cladding layer will form a heterojunction barrier on either type conductivity semiconductor (if it forms a barrier at all, similar to the formation of Schottky barriers by metals on either n-type or p-type semiconductors). Also, in the case of a p-n junction in semiconductor waveguides in contact with the electrode cladding layer, substantially ohmic heterojunction contact to the waveguide layer is facilitated by interposing a thin but more heavily doped contact layer of the same conductivity type as that of the next adjacent waveguide layer (which is in contact with this heavily doped layer). Although such a heavily doped contact layer would suppress or nullify the heterojunction barrier, there would still be a barrier at the p-n junction in the waveguide suitable for generating a depletion region where the electric modulating fields can be relatively large. However, such a waveguide structure with a p-n junction and heavily doped contact layer would suffer from greater complexity in fabrication than the simpler structure with the heterojunction barrier as illustrated in FIG. 1.

Figure 2:
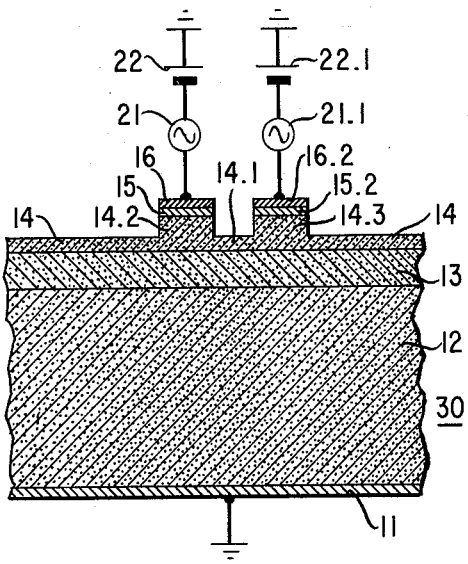
FIGS. 2 and 3 are, respectively, cross-section and top-view diagrams of a semiconductor optical directional coupler switching apparatus, in accordance with another specific embodiment of the invention.
Figure 3:
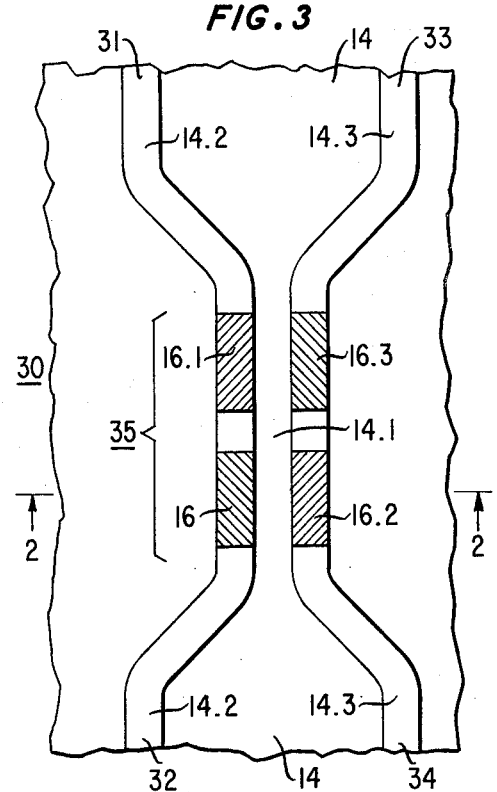

FIGS. 2 and 3 show a switchable optical directional coupler device 30 using a pair of rib waveguides in a structure similar to the above-described optical modulator device 10, except that there is a pair of mutually separated rib portions 14.2 and 14.3 in the coupler device 30. Elements in FIGS. 2 and 3 that are similar to those of FIG. 1 are indicated with the same reference numerals. Each rib has a pair of localized electrode cladding layers (15, 15.1 and 15.2, 15.3) contacting different localized areas of both rib portions 14.2 and 14.3 in an optical coupling (interaction) region 35 where the ribs are separated at closest approach by a distance of typically 1 to 2 micron, that is, a distance of several wavelengths as measured in the waveguide. At regions removed from the interaction region, these rib waveguides are separated by a distance of typically about 50 micron or more, that is, a distance typically equal to the total length of a rib or more. The rib 14.2 has a pair of optical ports 31 and 32, and the rib 14.3 has a pair of ports 33 and 34. To each of the electrodes 16, 16.1 and 16.2, 16.3 is applied a signal from a different electrical input signal source, thereby providing various types of optical switching functions combined with logic functions. Specifically, if the input signals instantaneously are adjusted such that phase matching of an optical TE-like mode can be provided in the interaction region 35, then an optical input wave at port 31 which propagates as that TE-like mode along the rib waveguide will emerge at port 34 rather than at port 32. It should be noted that localized variation, by means of etching for example, of the rib heights in the optical coupling region 35 can serve to control the phasematching by locally controlling the optical mode propagation constant. Thus, the rib heights of the different rib waveguides can be different in general.

Figure 4:
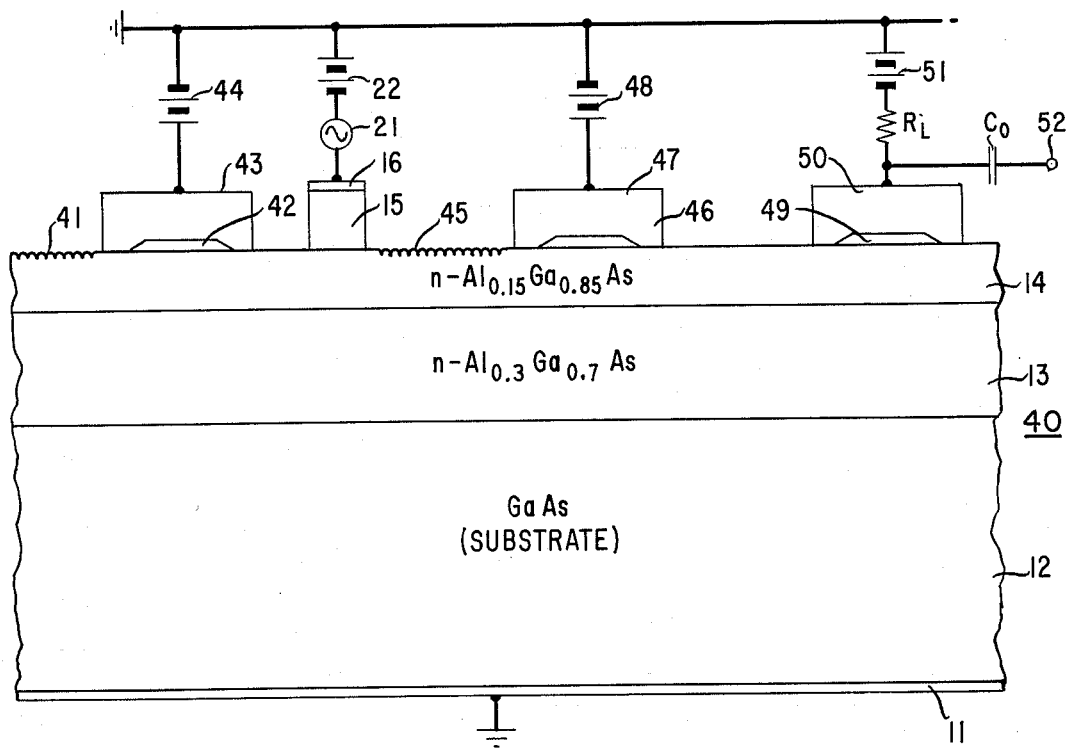
FIG. 4 is a cross-section diagram of a semiconductor integrated optical transistor, in accordance with still another embodiment of the invention.

FIG. 4 shows a cross-section diagram of an optical transistor device 40, that is, a device for amplifying electrical input from the electrical signal source 21 to produce an electrical output signal across an electrical load $R_L$. Elements in FIG. 4 which are similar to elements previously described in connection with FIG. 1 are labeled with the same reference numerals. Separate taper-coupled double heterostructure sections are formed in conjunction with the underlying single heterostructure waveguide in the device 40 by epitaxial localized n-type (or alternatively p-type) gallium arsenide layers 42, 46, and 49. These taper-coupled layers are coated by separate localized p-type aluminum gallium arsenide layers 43, 47, and 50, in each of which the ratio of aluminum to gallium typically is in the range of about 0.3 to 0.7. Thus, three separate taper-coupled double heterostructures (serving as laser, light amplifier, and light detector, respectively) are formed onto the layer 14 which serves as an optical waveguide layer for optically coupling the double heterostructures together, as more fully described below. These taper-coupled double heterostructures, and methods for fabricating them, are more fully described in the abovementioned copending patent application, Ser. No. 557,250.

The rib waveguide layer 14.2 can be wider (in the direction perpendicular to the plane of the drawing) in the neighborhoods of the taper-coupled laser, light amplifier, and/or light detector, in order to couple efficiently to the wider taper-coupled structures.

The p-type semiconductor layer 43 of the laser double heterostructure is positively (forward) biased by battery 44 sufficiently to produce laser action in the optical cavity produced in the waveguide layer 14 between a pair of distributed Bragg reflectors formed by suitable diffraction gratings such as striations (corrugations) in regions 41 and 45. Typically, the striations in these regions are characterized by a spatial periodicity of about 1300 angstroms or less, as formed by argon ion milling or etching masked by photoresist that has been patterned by standing optical waves, for example. In this way, only the desired mode(s) is reflected back and forth in the cavity between the diffraction grating regions, the other (unwanted) modes are diffracted out of the optical propagation path in the waveguide layer and cannot be collected into the taper-coupled light amplifier layer 46; whereas the desired laser mode indeed is multiply reflected to produce laser action in the cavity, and this mode is incident upon and collected by the taper-coupled layer 46. On the other hand, the desired laser mode intensity is modulated by the electrical signal from the source 21, which thereby modulates the effective optical path in the laser cavity between the diffraction grating regions 41 and 45. Thus, the signal from the source 21 tends to tune and detune the laser for a given wavelength and hence modulates the intensity of the optical wave arriving at the taper-coupled light amplifier layer 46.

The p-type layer 47 of the light amplifier is forward biased, so that amplification of the desired mode is achieved by stimulated emission. The thus amplified light is then coupled into and propagated through the waveguide layer 14 to the taper-coupled layer 49 of the light detector, where the light is absorbed and converted into charge carriers in the form of electron-hole pairs. These charges are collected under the influence of the electric field produced by the negative (reverse) voltage bias of the battery 51 applied to the p-type aluminum gallium arsenide layer 50. Alternatively, the aluminum gallium arsenide layer 50 can be n-type in combination with p-type gallium arsenide in the taper-coupled layer 49 (and with n-type conductivity aluminum gallium arsenide in the first and second epitaxial layers 13 and 14); so that the layers 14, 49, and 50 then form a conventional heterojunction transistor providing gain for the photocurrent in the layer 49. Thus, in any event, an instantaneous output voltage is developed across the load $R_L$ in accordance with the instantaneous optical intensity developed by the laser, in turn in accordance with the electrical signal of the source 21. This output voltage is delivered through a suitable coupling capacitor $C_o$ to an electrical signal output terminal 52. The output at terminal 52 can be used, for example, as an input electrical signal to another optical transistor (not shown) for cascade transistor amplifying action, or can be used directly as amplified electrical output.

In FIG. 4, the laser double heterostructure (containing the layers 42 and 43) is thus analogous to the "emitter" of a conventional bipolar transistor; the light amplifier double heterostructure (containing the layers 46 and 47) is analogous to the "drift" region of the conventional bipolar transistor; the light detecting double heterostructure (containing the layers 49 and 50) is analogous to the "collector" of the conventional transistor; and the electrode cladding layer 15 is analogous to the "base" electrode of the conventional transistor.

As an alternative in the optical transistor device 40, the electrode cladding layer 15 can overlap (or be coextensive with) and contact the diffraction region 45, for a distributed modulated optical feedback. Moreover, a second (not shown) electrode cladding layer can be applied to the other grating region 41, and different electrical signals can then be applied across each of the electrode cladding layers contacting the pair of diffraction grating regions 41 and 45. Thereby, the reflection versus wavelength properties of these grating regions can be tuned to the desired laser wavelength and hence can be used to tune and detune the laser.

Although the invention has been described in terms of specific embodiments, various modifications can be made without departing from the scope of the invention. For example, other group III–V semiconductor compounds than aluminum gallium arsenide can be used for the single and double heterostructures, such as aluminum gallium phosphide ($Al_xGa_{1-x}P$) with different $x$ for the different layers of the heterostructures, and various other III–V combinations such as $Ga_xIn_{1-x}As_yP_{1-y}$ with InP, or $GaAs_{1-x}Sb_x$ with $Al_yGa_{1-y}As_xSb_{1-x}$. Moreover, other materials than polycrystalline indium-tin oxide ($In_2O_3$–$SnO_2$ of chemical group III–IV–VI) and cadmium oxide (CdO of chemical group II–VI) may be useful for the electrode cladding layer material, so long as such material is electrically conducting and optically transparent (with respect to optical wavelengths used in the device) and at the same time forms a heterojunction barrier at the interface with the waveguide of at least 0.3 volt barrier height, advantageously about 0.4 to 1.0 volt or more, which enables the achievement of a good depth of modulation at reasonable signal level and which also provides a low optical loss characteristic in a relatively simply fabricated semiconductor structure. For example, polycrystalline zinc oxide and cadmium sulphide are other useful electrode cladding materials for the practice of the invention.

More generally, suitable electrode cladding material for a chemical group III-V semiconductor single heterostructure waveguide formed by the first and second epitaxial layers are other group II-VI and group III-IV-VI or group II-IV-VI polycrystalline compound semiconductors, for example, zinc selenide and cadmium stannate. These electrode cladding materials are generally composed of polycrystalline compounds of chemical constituent elements, at least one of which elements is not in common (alternatively, none of which is in common) with any chemical constituent element of the underlying semiconductor waveguide material.

What is claimed is:

1. In a semiconductor device for modulating optical radiation in response to an electrical signal
   (a) a first epitaxial semiconductor layer in direct physical contact with a second epitaxial semiconductor layer of the same conductivity type as that of the first epitaxial layer and of higher bulk refractive index than that of the first epitaxial layer, said second epitaxial layer having a relatively thick optical rib waveguide portion and a relatively thin slab portion, said rib waveguide portion having a major plateau surface;
   (b) a third layer contacting at least a first portion of the plateau surface of the rib waveguide portion, said third layer thereby forming a heterojunction with the rib portion of the second epitaxial layer, said heterojunction characterized by a barrier potential height of at least 0.3 volt, said third layer being essentially a semiconductor compound composed of chemical constituent elements at least one of which is different from every chemical constituent element of the semiconductor material of the first and second epitaxial layers, and said third layer being essentially a polycrystalline material having a bulk refractive index for said optical radiation that is less than that of the second epitaxial layer and having a free carrier concentration that is at least an order of magnitude higher than those of the first and second epitaxial layers.

2. The device of claim 1 in which said potential barrier height is at least about 0.4 volt.

3. The device of claim 1 in which said third layer is contacted by an ohmic contact layer having a terminal for the application thereto of electrical signals in order to modulate the optical radiation propagating through the rib waveguide portion of the second epitaxial layer in a rib waveguide mode.

4. The device of claim 1 in which both the first and second epitaxial layers are semiconductor materials of chemical group III-V.

5. The device of claim 4 in which the group III-V semiconductor materials of the first and second epitaxial layers, respectively, are, respectively, $Al_xGa_{1-x}As$ and $Al_yGa_{1-y}As$, where $x$ is greater than $y$.

6. The device of claim 5 in which the third layer is indium-tin oxide.

7. The device of claim 6 in which the indium-tin oxide is by weight essentially 91 percent indium oxide and 9 percent tin oxide, and is of bulk resistivity less than 0.1 ohm-centimeters.

8. The device of claim 5 in which the third layer is essentially cadmium oxide.

9. The device of claim 1 which further includes at least first, second and third separate double semiconductor heterostructure sections each of which is taper-coupled to a different region of the rib waveguide portion integrated in a monocrystalline substrate supporting the first and second epitaxial layers, whereby optical radiation generated in the first double heterostructure can be modulated and transmitted as modulated radiation into the second double heterostructure section where the modulated optical radiation is amplified and then taper-coupled into the third double heterostructure section where the amplified modulated optical radiation is detected.

10. An optical modulator which comprises:
    (a) a first semiconductive epitaxial layer essentially of $Al_xGa_{1-x}R$ on a semiconductor substrate;
    (b) a second semiconductive epitaxial waveguide layer for propagating optical radiation, said waveguide layer being essentially of $Al_yGa_{1-y}R$ which has been grown on an exposed surface of the first epitaxial layer, where R is selected from the group consisting of arsenic and phosphorus, $0<y<x$, and said second epitaxial layer having a relatively thick optical rib waveguide portion and a relatively thin slab portion, said rib waveguide portion having a plateau surface;
    (c) a third layer on a first surface portion of the plateau surface of the second epitaxial layer, said third layer consisting essentially of a chemical compound material having a bulk electrical resistivity which is at least an order of magnitude lower than those of both the first and second epitaxial layers and having at least one chemical constituent element which is different from every chemical element of the semiconductor constituent materials of the first and second epitaxial layers.

11. The modulator of claim 10 where R is As and the third layer is essentially polycrystalline cadmium oxide.

12. The modulator of claim 10 in which the third layer is polycrystalline indium-tin oxide.

13. The modulator of claim 11 in which the third layer has been deposited on an originally planar major surface of the second epitaxial layer, and in which the third layer has been removed from said planar major surface prior to reducing the thickness of the second epitaxial layer at the slab portion thereof.

14. Semiconductor apparatus for modulating optical radiation, which comprises
    (a) a semiconductor waveguide layer for propagating optical radiation parallel to a surface of said waveguide layer, said semiconductor waveguide layer having a relatively thick rib waveguide portion and a relatively thin slab portion contiguous with said rib waveguide portion, said rib waveguide portion having a plateau surface;
    (b) optical modulation means including a cladding layer in heterojunction contact with at least a portion of said plateau surface, said cladding layer being of an optically transparent material whose free carrier concentration is at least one order of magnitude more than that of the said waveguide layer and whose bulk refractive index is lower than that of the waveguide layer, said transparent material being a compound composed essentially of chemical constituent elements at least one of which is not a constituent element of the said waveguide layer.

15. Apparatus according to claim 14 in which said heterojunction is characterized by a potential barrier height of at least 0.4 volt.

16. Apparatus according to claim 15 in which said cladding layer is polycrystalline and in which said waveguide layer is an epitaxial semiconductor layer.

17. Apparatus according to claim 14 in which said cladding layer is polycrystalline and in which said waveguide layer is an epitaxial semiconductor layer.

18. Apparatus according to claim 14 in which said waveguide layer is a second epitaxial semiconductor layer grown on a first epitaxial semiconductor layer of lower refractive index than the second epitaxial layer and in which the cladding layer is a polycrystalline material of a compound composed essentially of chemical constituent elements which are all different from every chemical constituent element of the first and second epitaxial layers.

19. Apparatus according to claim 18 in which the second epitaxial layer contains the relatively thick rib portion and the relatively thin slab portion, and in which $n_r^2 - n_e^2$ is greater than $0.3 n_r^2$, where $n_r$ is the bulk refractive index of the second epitaxial layer rib portion and $n_e$ is the bulk refractive index of the cladding layer.

* * * * *